(12) United States Patent
Witt et al.

(10) Patent No.: US 11,456,702 B2
(45) Date of Patent: Sep. 27, 2022

(54) BROADBAND HIGH POWER AMPLIFIER

(71) Applicant: Rohde & Schwarz GmbH & Co. KG, Munich (DE)

(72) Inventors: Thomas Witt, Rangsdorf (DE); Florian Ohnimus, Berlin (DE); Uwe Dalisda, Fürstenfeldbruck (DE); Wolfram Titze, Berlin (DE); Andreas Andrei, Petershagen (DE); Raimon Göritz, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 602 days.

(21) Appl. No.: 16/521,929

(22) Filed: Jul. 25, 2019

(65) Prior Publication Data

US 2020/0036334 A1    Jan. 30, 2020

(30) Foreign Application Priority Data

Jul. 25, 2018 (EP) .................................... 18185582

(51) Int. Cl.
*H03F 1/02* (2006.01)
*G01R 31/00* (2006.01)
(Continued)

(52) U.S. Cl.
CPC ......... *H03F 1/0205* (2013.01); *G01R 31/002* (2013.01); *H03F 1/06* (2013.01);
(Continued)

(58) Field of Classification Search
CPC . H03F 1/0205; H03F 1/06; H03F 3/21; H03F 3/22; H03F 2200/135;
(Continued)

(56) References Cited

U.S. PATENT DOCUMENTS 4,250,462 A    2/1981  Iwer et al.
4,924,191 A *  5/1990  Erb .................. H03F 1/0244
                                                330/296

(Continued)

FOREIGN PATENT DOCUMENTS

CN    104158501 A    11/2014
CN    104158501 B     6/2017
(Continued)

OTHER PUBLICATIONS

Extended European search report for European Patent Application No. 18185582.6, dated Nov. 16, 2018, 9 pages.

*Primary Examiner* — Tung X Nguyen
*Assistant Examiner* — Robert P Alejnikov, Jr.
(74) *Attorney, Agent, or Firm* — Westman, Champlin & Koehler, P.A.

(57) ABSTRACT

The invention relates to a broadband high power amplifier that comprises a signal input adapted to receive an input signal, at least one amplifier stage adapted to amplify the received input signal, a signal output adapted to output the signal amplified by the at least one amplifier stage as an output signal, a monitoring unit adapted to monitor signal characteristics of the input signal and the output signal and
(Continued)

a control unit adapted to operate the at least one amplifier stage at an optimal operating point depending on the current signal characteristics monitored by said monitoring unit.

16 Claims, 4 Drawing Sheets

(51) Int. Cl.
    *H03F 1/06*           (2006.01)
    *H03F 3/21*           (2006.01)
    *H03F 3/22*           (2006.01)

(52) U.S. Cl.
    CPC ................. *H03F 3/21* (2013.01); *H03F 3/22* (2013.01); *H03F 2200/135* (2013.01); *H03F 2200/451* (2013.01)

(58) Field of Classification Search
    CPC ......... H03F 2200/451; H03F 2200/114; H03F 2200/36; H03F 2200/393; H03F 1/486; H03F 3/189; H03F 1/04; H03F 1/0222; H03F 1/0233; H03F 1/025; H03F 1/0255; H03F 1/0266; H03F 1/0272; H03F 1/50; H03F 3/195; H03F 3/213; H03F 1/0211; H03F 1/42; H03F 3/211; H03F 3/217; H03F 3/2178; G01R 31/002; G01R 1/30; G01R 31/001; G01R 31/003
    USPC ............... 324/750.14, 123 R; 330/2, 75, 155
    See application file for complete search history.

(56) References Cited

U.S. PATENT DOCUMENTS

| | | | | |
|---|---|---|---|---|
| 6,621,336 | B1* | 9/2003 | Johnson | H03F 3/217 |
| | | | | 330/51 |
| 7,783,272 | B2* | 8/2010 | Magnusen | H04N 7/102 |
| | | | | 330/296 |
| 8,653,890 | B1* | 2/2014 | Ahmed | H03F 3/195 |
| | | | | 330/124 R |
| 8,907,728 | B2 | 12/2014 | Watkins | |
| 2002/0079960 | A1* | 6/2002 | Myers | H03F 1/0244 |
| | | | | 330/10 |
| 2005/0083114 | A1* | 4/2005 | Risbo | H03F 3/217 |
| | | | | 330/10 |
| 2009/0295483 | A1* | 12/2009 | Alidio | H03F 3/604 |
| | | | | 330/277 |
| 2011/0068865 | A1 | 3/2011 | Mohamadi et al. | |
| 2013/0021103 | A1 | 1/2013 | Watkins | |
| 2014/0354350 | A1* | 12/2014 | Bowers | H03F 1/301 |
| | | | | 327/564 |
| 2015/0171768 | A1* | 6/2015 | Perreault | H02M 7/537 |
| | | | | 330/251 |
| 2020/0036334 | A1* | 1/2020 | Witt | H03F 1/06 |

FOREIGN PATENT DOCUMENTS

| | | |
|---|---|---|
| GB | 2477572 A | 8/2011 |
| KR | 20100083415 A | 7/2010 |
| WO | 2008/002787 A2 | 1/2008 |
| WO | 2014021932 A1 | 2/2014 |
| WO | 2015176077 A2 | 11/2015 |

* cited by examiner

BROADBAND HIGH POWER AMPLIFIER

CROSS-REFERENCE TO RELATED APPLICATION(S)

This application claims priority to European Patent Application No. 18185582.6, filed on Jul. 25, 2018, the content of which is hereby incorporated in its entirety by reference.

FIELD OF THE INVENTION

The invention relates to a broadband high power amplifier and to a method for operating such a broadband high power amplifier.

TECHNICAL BACKGROUND

Broadband power amplifiers can be widely used, in particular for testing purposes. During development of a product in a laboratory, in production of electronic products as well as for quality monitoring of produced electronic devices broadband high power amplifiers are often used for performing tests, in particular verification tests and validation tests. Typical tests comprise intermodulation, multitone and peak-to-average-ratio tests as well as aging or slam tests. A subset of these tests can also be performed during production as part of a quality assurance process. In conventional test setups, broadband high power amplifiers are often not optimally operated with regard to output power, signal quality and efficiency because they operate at fixed operating points.

A high power amplifier is conventionally configured to have its operating point in the middle of its linear power amplification range. The reason for this is that in conventional setups, there is normally little a priori knowledge of the received input signal to be amplified by the broadband high power amplifier. In conventional setups, the power amplifiers are dimensioned according to their maximum output power and therefore often used below their maximum power capacity. Conventional broadband power amplifiers need to deal with different excitation frequencies, power levels, signal types, modulation bandwidths and load conditions. Conventional broadband power amplifiers are operated at a fixed operating point defined by an operation voltage and an operation electrical current wherein the operating point is set to achieve a more or less satisfactory compromise for the different operation scenarios. In conventional setups, the broadband amplifier does comprise a preconfigured bias operation current set independently of the desired output power of the broadband amplifier. In case of low output power, the complete power of the broadband amplifier does not find its way to the signal output of the broadband amplifier and has to be terminally dissipated, i.e. the power consumption of the broadband power amplifier is more or less constant regardless of the output power applied by the broadband power amplifier to its connected load. Consequently, the power efficiency of a conventional broadband high power amplifier can be quite low.

SUMMARY OF THE INVENTION

Accordingly, there is the need to provide a broadband high power amplifier whose operation can be optimized according to the requirements of its environment, in particular a test environment.

According to a first aspect of the present invention, a broadband high power amplifier comprising the features of claim 1 is provided.

The invention provides according to the first aspect of the present invention a broadband high power amplifier comprising a signal input adapted to receive an input signal, at least one amplifier stage adapted to amplify the received input signal, a signal output adapted to output the signal amplified by the at least one amplifier stage as an output signal, a monitoring unit adapted to monitor signal characteristics of the input signal and the output signal and a control unit adapted to operate the at least one amplifier stage at an optimal operating point depending on the current signal characteristics monitored by said monitoring unit.

According to a second aspect of the present invention, a method for operating a broadband high power amplifier comprising the features of claim 14 is provided.

The invention provides according to the second aspect a method for operating a broadband high power amplifier having one or more amplifier stages, the method comprising the steps of:

monitoring signal characteristics of an input signal received at a signal input of an amplifier stage of said broadband high power amplifier and signal characteristics of an output signal output at a signal output of the amplifier stage of said broad band high power amplifier and controlling the at least one amplifier stage of said broadband high power amplifier to operate at an optimal operation point depending on the monitored signal characteristics.

The invention further provides according to a further aspect an electromagnetic compatibility, EMC, test setup comprising a broadband high power amplifier having the features of a broadband high power amplifier comprising the features of claim 1 according to the first aspect of the present invention and further being used to amplify a continuous wave or pulsed RF test signal.

In a possible embodiment of the broadband high power amplifier according to the first aspect of the present invention, the control unit is adapted to operate the at least one amplifier stage at an optimal operating point which achieves at least one predefined or selected optimization criterion.

In a further possible embodiment of the broadband high power amplifier according to the first aspect of the present invention, the control unit is adapted to adjust continuously or with preset increments an operation current and/or an operation voltage of at least one transistor or of at least one power tube of the at least one amplifier stage to operate said amplifier stage at the optimal operation point.

In a still further possible embodiment of the broadband high power amplifier according to the first aspect of the present invention, the control unit is adapted to adjust continuously or with preset increments a quiescent current and/or a supply voltage of at least one transistor or at least one power tube of the at least one amplifier stage to operate the amplifier stage at the optimal operating point.

In a still further possible embodiment of the broadband high power amplifier according to the first aspect of the present invention, the monitoring unit is adapted to monitor at the signal input of the broadband high power amplifier at least one of the following signal characteristics of the received input signal:

an average input power of the input signal, a peak input power of the input signal, a frequency of the input signal and a bandwidth of the input signal.

In a further possible embodiment of the broadband high power amplifier according to the first aspect of the present invention, the monitoring unit is adapted to monitor at the signal output of the broadband high power amplifier at least one of the following signal characteristics of the output signal comprising an average forward power,
a peak forward power,
a phase of the forward signal,
an average reflected power,
a peak reflected power and
a phase of the reflected signal.

In a further possible embodiment of the broadband high power amplifier according to the first aspect of the present invention, the optimization criterion applied by the control unit to adjust the operating point of the at least one amplifier stage comprises maximizing of forward power into a load connected to the signal output of the broadband high power amplifier, maximizing a power efficiency of the broadband high power amplifier and minimizing power dissipation of the broadband high power amplifier.

In a further possible embodiment of the broadband high power amplifier according to the first aspect of the present invention, the optimal operating point of the amplifier stage is provided inside a linear operation range of said amplifier stage or outside the linear operation range of the amplifier stage.

In a further possible embodiment of the broadband high power amplifier according to the first aspect of the present invention, the amplifier stages comprise solid-state amplifier stages including power transistors.

In a still further possible embodiment of the broadband high power amplifier according to the first aspect of the present invention, the amplifier stages comprise power tube amplifier stages comprising power tubes.

In a still further possible embodiment of the broadband high power amplifier according to the first aspect of the present invention, the amplifier stages comprise switched amplifier stages In a still further possible embodiment of the broadband high power amplifier according to the first aspect of the present invention, the amplifier stages comprise conduction angle amplifier stages.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

The present invention is described in greater detail in the following on the basis of the embodiments shown in the schematic figures of the drawings, in which.

Figure 1:
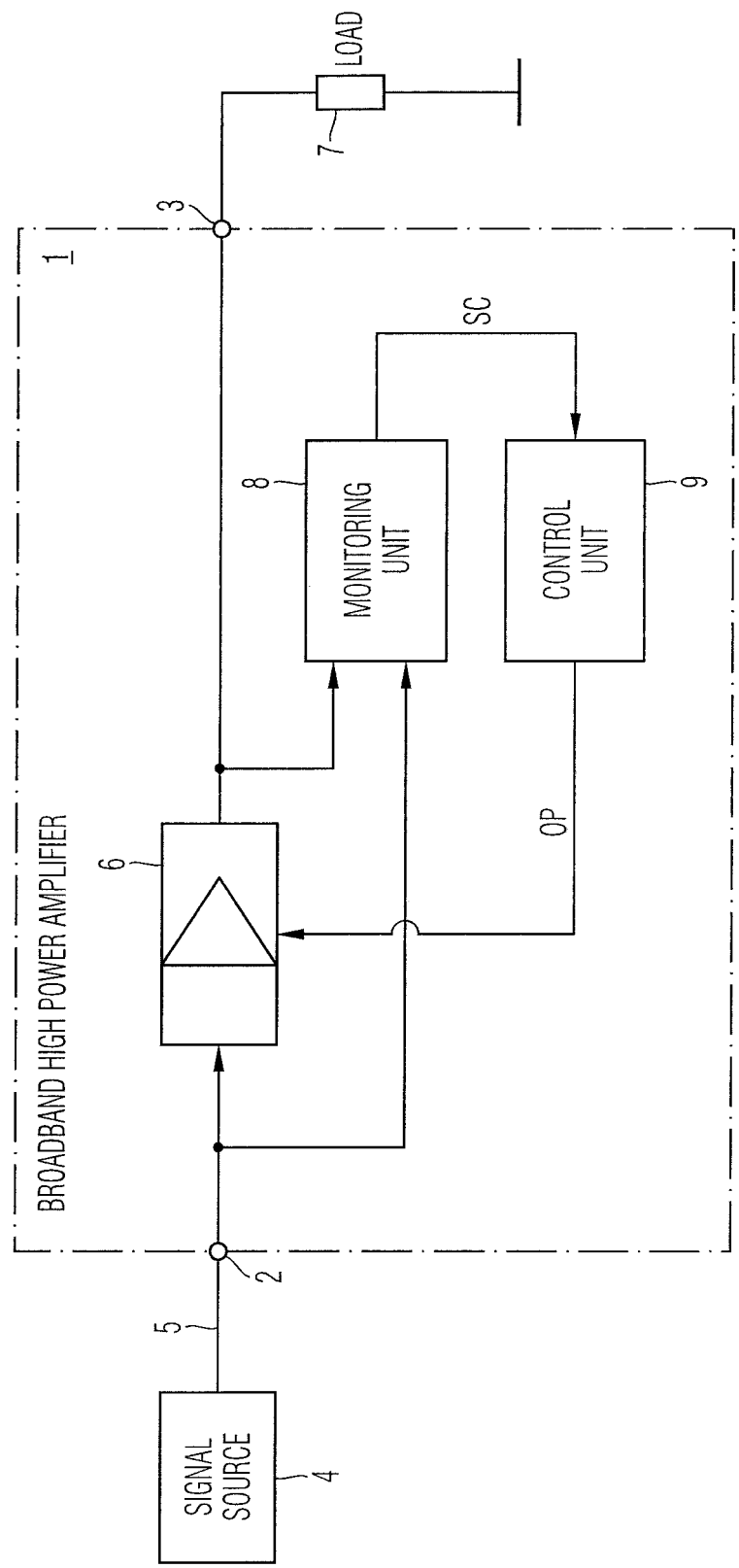
FIG. 1 shows a block diagram of a possible exemplary embodiment of a broadband high power amplifier according to the first aspect of the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

FIG. 1 shows a block diagram of a possible exemplary embodiment of a broadband high power amplifier 1 according to the first aspect of the present invention. The broadband high power amplifier 1 comprises a signal input 2 and a signal output 3. The signal input 2 receives a signal from a signal source 4 via a signal line 5. The broadband high power amplifier 1 comprises at least one amplifier stage 6 adapted to amplify the received input signal and to output the amplified signal at the signal output 3 of the broadband high power amplifier 1. As can be seen in FIG. 1, an external load 7 is connected to the signal output 3 of the broadband high power amplifier 1.

The broadband high power amplifier 1 comprises a monitoring unit 8 adapted to monitor signal characteristics of the input signal applied to the amplifier stage 6 and signal characteristics of the amplified output signal generated by the amplifier stage 6. The monitoring unit 8 is adapted to supply the monitored signal characteristics to a control unit 9 of the broadband high power amplifier 1 as illustrated in FIG. 1. The control unit 9 of the broadband high power amplifier 1 is adapted to operate the at least one amplifier stage 6 of the broadband high power amplifier 1 at an optimal operating point OP. The operating point OP is determined by the control unit 9 depending on the current signal characteristics received from the monitoring unit 8. The control unit 9 is adapted to operate the amplifier stage 6 at the optimal operating point set by the control unit 9 to achieve at least one predefined or selected optimization criterion C. The control unit 9 can adjust continuously or with preset increments an operation current Ioc and/or an operation voltage Vop of at least one electronic component within the power amplifier stage 6 to operate the amplifier stage 6 at the current optimal operation point OP set depending on the monitored current signal characteristics received from the monitoring unit 8.

The amplifier stage 6 can comprise a solid-state amplifier stage including power transistors. These power transistors can comprise bipolar transistors or MOSFETs. In this embodiment, the control unit 9 can adjust continuously or with preset increments an operation current and/or an operation voltage of at least one transistor within the solid-state amplifier stage 6. In a possible embodiment, the control unit 9 can adjust a quiescent electrical current and/or a supply voltage of at least one transistor integrated in the amplifier stage 6.

In a further possible embodiment, the amplifier stage 6 can also comprise a power tube amplifier stage comprising power tubes. In this embodiment, the control unit 9 can be adapted to adjust continuously or with preset increments an operation current and/or an operation voltage of a tube within the power tube amplifier stage 6.

The amplifier stage 6 comprising power transistors and/or power tubes has in a possible embodiment a passive or active cooling device adjusted to cool the respective amplifier stage 6. The cooling device can comprise an air or liquid cooling device. In a possible embodiment, an active cooling device attached to the amplifier stage 6 can also be controlled by the control unit 9 according to the received signal characteristics detected by the monitoring unit 8.

The amplifier stage 6 as illustrated in the embodiment of FIG. 1 can comprise a specific amplifier class. The amplifier stage 6 can comprise a switched amplifier stage and/or a conduction angle amplifier stage. The switching amplifier stages use digital circuits and pulse width modulation PWM to constantly switch a signal between fully on and fully off driving the output signal into a saturation and cutoff region of the transistor of the amplifier stage. Conduction angle amplifiers are defined by a length of the conduction state over some portion of the output waveform such that the output stage transistor operation lies somewhere between being fully on and fully off.

The monitoring unit 8 of the broadband high power amplifier 1 is adapted to monitor the signal input 2 of at least one of the following signal characteristics comprising an average input power of the input signal, a peak input power of the input signal, a frequency of the input signal and/or a bandwidth of the input signal.

The monitoring unit 8 is further adapted to monitor at the signal output 3 at least one of the following signal characteristics of the output signal comprising an average forward power, a peak forward power, a phase of a forward signal, an average reflected power, a peak reflected power and/or a phase of the reflected signal.

The optimization criterion C applied by the control unit 9 to adjust the operation point OP of the amplifier stage 6 can be predefined or selected by a user or by a test setup controller. The optimization criterion C can comprise the maximization of forward power into the load 7 connected to the signal output 3 of the broadband high power amplifier 1. Further, the at least one optimization criterion C applied by the control unit 9 to adjust the operating point OP of the amplifier stage 6 can also comprise maximizing a power efficiency of the broadband high power amplifier 1. In a still further possible embodiment, the optimization criterion C applied by the control unit 9 to adjust the operating point OP of the amplifier stage 6 can also comprise minimizing a power dissipation by the broadband high power amplifier 1. The optimal operating point OP set by the control unit 9 in response to the received signal characteristics detected by the monitoring unit 8 can be located inside a linear operation range of the amplifier stage 6 or outside of the linear operation range of the amplifier stage 6.

The signal supplied by the signal source 4 to the signal input 2 of the broadband high power amplifier 1 can comprise an RF signal, in particular an RF test signal. The RF test signal can comprise a continuous wave or pulsed RF test signal. The broadband high power amplifier 1 as illustrated in FIG. 1 can form part of an electromagnetic compatibility, EMC, test setup.

Figure 2:
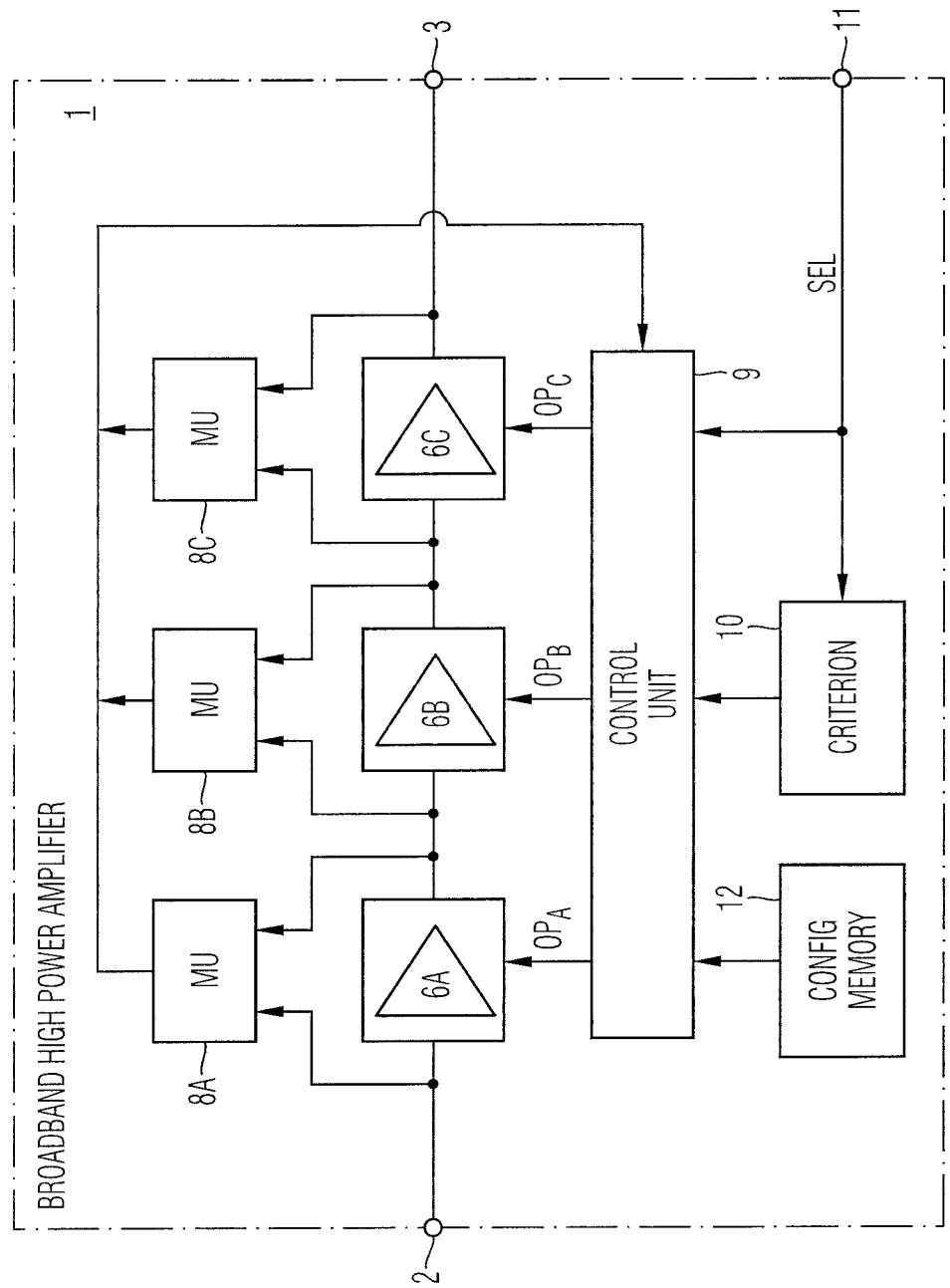
FIG. 2 shows a block diagram of a further possible exemplary embodiment of a broadband high power amplifier according to the first aspect of the present invention.

FIG. 2 shows a block diagram of a further possible exemplary embodiment of a broadband high power amplifier 1 according to the first aspect of the present invention. In the illustrated exemplary embodiment, the broadband high power amplifier 1 comprises several amplifier stages 6A, 6B, 6C connected in series between the signal input 2 and the signal output 3 of the broadband high power amplifier 1. Each of the amplifier stages 6A, 6B, 6C is monitored by an associated monitoring unit 8A, 8B, 8C providing detected signal characteristics to a control unit 9 adapted to operate each of the amplifier stages 6A, 6B, 6C at an optimal operating point OPA, OPB, OPC, wherein each operating point OP achieves at least one predefined or selected optimization criterion C. Accordingly, each amplifier stage 6A, 6B, 6C can be operated according to the same optimization criterion or different optimization criteria. The optimization criterion C can be predefined and chosen according to the capabilities of the respective amplifier stage 6A, 6B, 6C. The amplifier stages 6A, 6B, 6C of the broadband high power amplifier 1 can comprise amplifiers stages of different classes, in particular switching amplifier stages such as class D amplifier stages and/or non-switching conduction angle amplifiers such as class A, B, AB and class C amplifier stages. Different criteria used by the control unit 9 for one or several amplifier stages 6A, 6B, 6C can be stored locally in a memory 10 of the broadband high power amplifier 1. In a possible embodiment, an optimization criterion C to be applied for defining the operation point OP for a specific amplifier stage can be selected by a selection signal SEL applied to a selection input 11 of the broadband high power amplifier 1. The selection signal SEL can be applied to the selection input 11 from an external controller, for instance from an external controller of a test device of a test setup. Further, the selection signal can be applied by a user via a user interface UI of the test setup. The criteria C stored in the local memory 10 of the broadband high power amplifier 1 can comprise maximization of forward power into a load connected to the signal output 3 of the broadband high power amplifier 1. Further, the criterion C can also comprise the maximizing of the power efficiency of the respective amplifier stage controlled by the control unit 9. Further, the optimization criterion C stored in the local memory 10 can also comprise maximizing a power dissipation of the respective amplifier stage of the broadband high power amplifier 1. In a further possible embodiment of the broadband high power amplifier 1, the broadband high power amplifier 1 can also comprise a configuration memory 12 as illustrated in the embodiment of FIG. 2. The configuration memory 12 can indicate in a possible embodiment the amplifier classes of the different amplifier stages 6A, 6B, 6C integrated in the broadband high power amplifier 1. In a possible embodiment, the control unit 9 can read for each power amplifier stage 6A, 6B, 6C an associated amplifier class as specified in the configuration memory 12 to set an optimal operating point OP for the respective amplifier stage 6A, 6B, 6C depending on the amplifier class of the respective amplifier stage and depending on the at least one optimization criterion C selected for the respective amplifier stage in response to the applied selection signal SEL. The operating point OP set by the control unit 9 can be within a linear operation range of the respective amplifier stage or outside the linear operation range of the respective amplifier stage. The control unit 9 can adjust a quiescent or bias current and/or a supply voltage of at least one transistor or tube element of the respective amplifier stage 6A, 6B, 6C to operate the respective amplifier stage 6A, 6B, 6C at the determined optimal operating point OP. The adjustment of the quiescent or bias current and/or the supply voltage can be performed continuously or with preset increments by the control unit 9 of the broadband high power amplifier 1. In the illustrated exemplary embodiment of FIG. 2, each amplifier stage 6A, 6B, 6C comprises an associated internal monitoring unit 8A, 8B, 8C adapted to monitor signal characteristics at the signal input and at the signal output of the respective amplifier stage 6A, 6B, 6C. In an alternative embodiment, the broadband high power amplifier 1 comprises a single monitoring unit to which the signal input 2 and the signal output 3 of a selected amplifier stage 6A, 6B, 6C is switched by means of a multiplexer controlled by the control unit 9. In this embodiment, a single monitoring unit 8 can detect the signal characteristics of the selected amplifier stage.

In a possible implementation, the selection control signal SEL applied to the broadband high power amplifier 1 can identify a specific amplifier stage within the group of available amplifier stages 6A, 6B, 6C and further indicate an associated optimization criterion C for the selected amplifier stage.

The number and class types of the different amplifier stages integrated in the broadband high power amplifier 1 as illustrated in FIG. 2 can vary depending on the application and use case of the broadband high power amplifier 1.

In a possible embodiment of the broadband high power amplifier 1 as illustrated in the embodiment of FIG. 2, the amplifier stages 6A, 6B, 6C can be formed by plug-in amplifier stages which can be received in a possible implementation by receiving slots of the broadband high power amplifier 1. In a possible implementation, an amplifier stage of a first class can be plugged into a first receiving slot of the broadband high power amplifier 1 to define the first amplifier stage 6A. A second amplifier stage of the same or different amplifier class can be plugged into a second receiving slot of the broadband high power amplifier 1 to provide the second amplifier stage 6B of the broadband high power amplifier 1, etc. Further, in the configuration memory 12, different class types and performance specifications of the inserted amplifier stages can be memorized and used by the control unit 9 to calculate the optimal operation point OP. In a possible implementation, the configuration data stored in the configuration memory 12 can also be input via a configuration interface of the broadband high power amplifier 1.

In the illustrated embodiment of FIG. 2, the different amplifier stages 6A, 6B, 6C are connected in series to each other. In alternative embodiments, the amplifier stages can also be connected in series and/or in parallel to each other. The broadband high power amplifier 1 as illustrated in the embodiments of FIG. 1, FIG. 2 can be used in an electromagnetic compatibility, EMC, test setup. The broadband high power amplifier 1 can be used to amplify a continuous wave or pulsed RF test signal. Electromagnetic compatibility EMC is defined as the ability of devices and systems to operate in the electromagnetic environment without impairing their functions and without faults and vice versa, i.e. to ensure that operation does not influence the electromagnetic environment to the extent that the functions of other devices and systems are adversely affected. EMC testing is a means of verifying devices and system abilities. Interference sources can comprise natural sources (atmospheric noise, electrostatic discharge) and technical sources. Interference technical sources can comprise intentional RF signal generation, e.g. by telecommunication systems or other systems such as navigation systems or microwave ovens. The technical sources can also comprise unintentional RF generation sources providing broadband low RF energy. These RF generation sources can comprise power electronics, computers, energy distribution, ignition systems, etc.

An electronic component or device has to meet certain electromagnetic susceptibility (EMS) and/or electromagnetic interference (EMI) specifications. As part of an EMC test procedure, susceptibility tests can be performed on a device under test DUT. During such tests, the device under test DUT is subjected to an electromagnetic field. The device under test DUT is checked to determine if it still operates properly and is therefore immune to disturbances from external sources such as signals from broadcast transmitters or mobile phone base stations. Electromagnetic fields can be generated by broadband power amplifiers that deliver a required output power and are robust against mismatch. A broadband high power amplifier 1 used in the test setup are tuned in a possible embodiment by the control unit 9 to provide an optimal operation point OP applied to the at least one amplifier stage 6. The control unit 9 can take into account the selected optimization criterion read from the memory 10, the amplifier class of the respective stage read from the configuration memory 12 and the current signal characteristics of the respective amplifier stage 6 received from the integrated monitoring unit 8 of the broadband high power amplifier 1. In a possible embodiment, the broadband amplifier 1 can generate an amplified signal in particular an amplified test signal in a frequency range between around 9 kHz and 6 GHz.

Figure 3A:
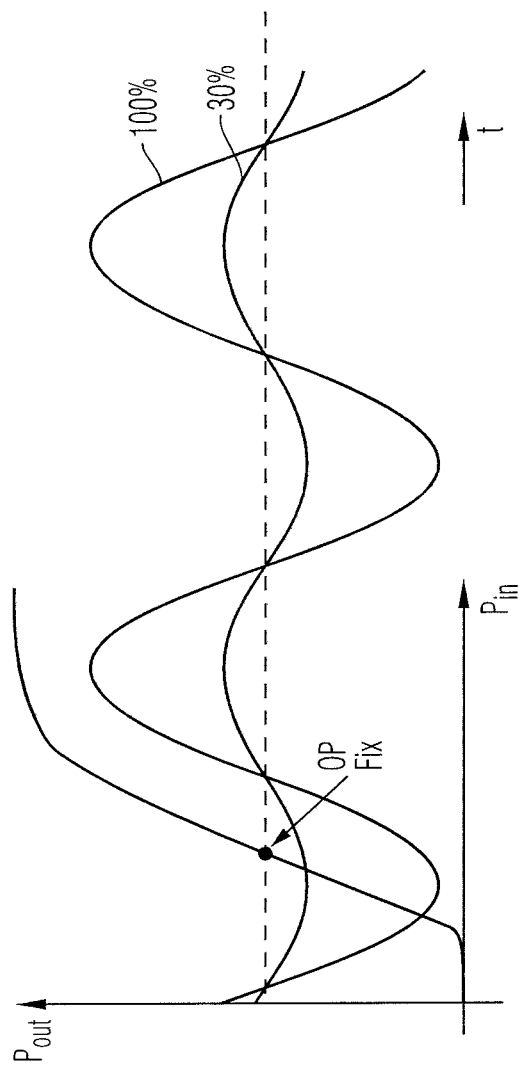
FIG. 3A shows a signal diagram for illustrating the operation of a broadband high power amplifier in comparison to a conventional broadband high power amplifier.
Figure 3B:
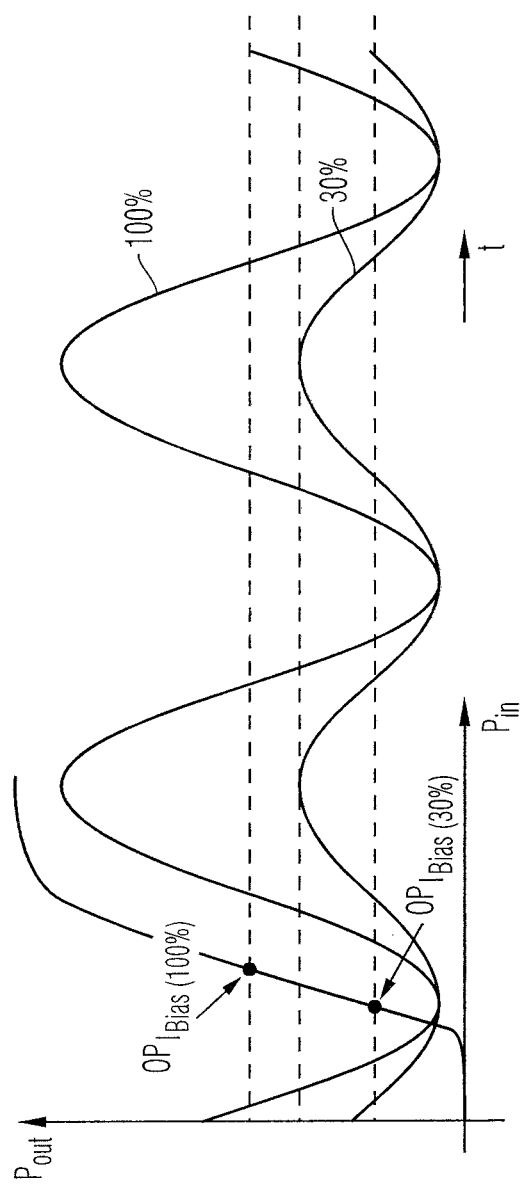
FIG. 3B shows a further signal diagram for illustrating the operation of a broadband high power amplifier in comparison to a conventional broadband high power amplifier.

FIGS. 3A, 3B illustrate the operation of a broadband high power amplifier 1 according to the present invention in comparison to a conventional broadband high power amplifier. FIG. 3A illustrates the operation point OP of a conventional broadband high power amplifier having a fixed bias current to operate its integrated amplifier stage at a fixed operation point OP. In contrast, as illustrated in FIG. 3B, the broadband high power amplifier 1 comprises an amplifier stage whose operating point OP is controlled by a control unit 9. The control unit 9 can for instance change the bias or quiescent current IBIAS of at least one amplifier stage dynamically during operation as illustrated in FIG. 3B. For instance, the bias current can be reduced depending on the current signal characteristics detected by the monitoring unit 8 from 100% to 30% as illustrated in FIG. 3B.

Figure 4:
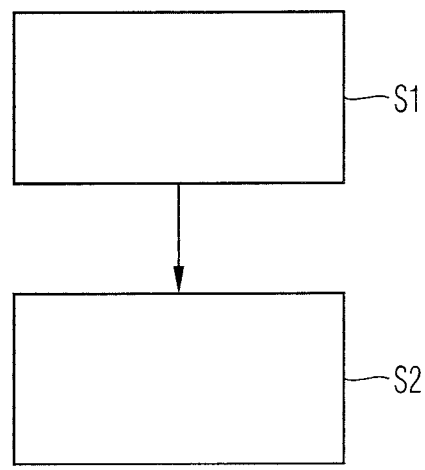
FIG. 4 shows a flowchart of a possible exemplary embodiment of a method for operating a broadband high power amplifier according to a second aspect of the present invention.

FIG. 4 shows a flowchart of a possible exemplary embodiment of a method for operating a broadband high power amplifier 1 according to a further aspect of the present invention.

In the illustrated embodiment of FIG. 4, the method comprises two main steps. In a first step S1, signal characteristics of an input signal received at a signal input and signal characteristics of an output signal output by a signal output of an amplifier stage of the broadband high power amplifier 1 are monitored, e.g. by a monitoring unit 8 as illustrated in FIG. 1.

In a further step S2, the at least one amplifier stage 6 of the broadband high power amplifier 1 is controlled to operate at an optimal operation point OP depending on the monitored signal characteristics. In step S2, the operation current and/or an operation voltage of at least one transistor or tube of the amplifier stage 6 within the broadband high power amplifier 1 is adjusted continuously or with preset increments to operate the respective amplifier stage 6 at its optimal operation point OP which is determined in response to the monitored signal characteristics according to at least one predefined or selected optimization criterion C.

The method illustrated in FIG. 4 can be used to optimize the operation of a broadband high power amplifier 1 used for EMC immunity testing (product validation testing, wireless communication and/or slam testing). For EMC testing setups, there exists a good a priori knowledge of a level or content and modulation scheme, e.g. a signal shape that is fed into the signal input of the broadband high power amplifier 1. This knowledge is used by the control unit 9 to operate the at least one the amplifier stage constantly around or at least near an ideal operational point by closely monitoring different parameters or signal characteristics and by adjusting a bias current and/or a supply voltage of the respective amplifier stage 6 according to at least one optimization criterion C. The constant monitoring and adapting of operational parameters of the amplifier stage 6 further results in a good overload protection of the broadband high power amplifier 1 at any time. By operating the at least one amplifier stage 6 at the adjusted operating point OP it is possible to reduce the energy consumption and/or heat dissipation of the amplifier stage 6.

Based on the detected and monitored signal characteristics, an output power relative to a maximum possible output power and/or the frequency and/or load conditions the operating point OP can be adjusted by the control unit 9 by an adaptive and continuous adjustment dynamically of a quiescent current of one or more transistors of a solid-state amplifier stage and/or by adaptive and continuous adjustment of a voltage, in particular drain voltage, of one or more transistors of a solid-state amplifier stage. By reducing the energy consumption of a power amplifier stage, additional benefits can be achieved such as reduced acoustic noise because of less required cooling of the amplifier stage 6 by a cooling fan. Further, the operation lifetime of the broadband high power amplifier 1 is increased.

The operating point OP of the at least one power amplifier stage 6 is optimized by the control unit 9 in dependency of power, frequency, signal characteristics and load conditions in order to achieve one or more of optimization criteria C including maximizing the forward power into the load, to achieve a best possible in and out of band signal quality and maximizing a power efficiency, especially at reduced power, and to achieve a reduction of power dissipation having the benefit for reduction of a fan speed of a cooling fan and/or to reduce the noise generated by the broadband high power amplifier 1. The signal applied by the broadband high power amplifier 1 can further comprise in a possible embodiment an audio and/or a video signal. In a further possible embodiment, the signal applied to the broadband high power amplifier 1 can comprise a test signal, in particular an RF test signal used in a test setup for testing electronic devices. The broadband high power amplifier 1 according to the present invention can comprise amplifier stages 6 of the same or different amplifier classes. The operation point OP of each amplifier stage 6 can be optimized by the control unit 9 by measured characteristics, i.e. on the basis of a current operation state of the broadband high power amplifier 1. In a possible embodiment, the broadband high power amplifier 1 can be integrated in a test or measurement device adapted to test a device under test DUT. The control unit 9 can comprise at least one processor adapted to generate control signals to adjust an operation current and/or an operation voltage of at least one amplifier stage within the broadband high power amplifier 1.

In a possible embodiment, the control unit 9 has access to further configuration parameters and other information relevant for setting the operation point OP of the different amplifier stages such as the resistance of the load 7 connected to the output terminal 3 of the broadband high power amplifier 1 and/or information about the signal source 4 connected to the signal input 2 of the broadband high power amplifier 1.

Although the present invention has been described in the above by way of preferred embodiments, it is not limited thereto, but rather can be modified in a wide range of ways. In particular, the invention can be changed or modified in various ways without deviating from the core of the invention.

What is claimed is:

1. A broadband high power amplifier, the broadband high power amplifier comprising:
   a signal input adapted to receive an input signal;
   at least one amplifier stage adapted to amplify the received input signal, wherein the amplifier stage comprise amplifier stages of different classes selected from at least one of switching amplifier stages such as class D amplifier stages and/or non-switching conduction angle amplifiers such as class A, B, AB and class C amplifier stages;
   a signal output adapted to output the signal amplified by the at least one amplifier stage as an output signal;
   a monitoring unit adapted to monitor signal characteristics of the input signal and the output signal; and
   a control unit adapted to operate the at least one amplifier stage at an optimal operating point depending on the current signal characteristics monitored by said monitoring unit, wherein the control unit is adapted to operate the at least one amplifier stage at an optimal operating point which achieves at least one predefined or selected optimization criterion, and wherein the control unit is adapted to take into account the selected optimization criterion, the amplifier class of the respective stage, and the current signal characteristics of the respective amplifier stages received from the monitoring of the broadband high power amplifier.

2. The broadband high power amplifier of claim 1 wherein the control unit is adapted to adjust continuously or with preset increments an operation current or an operation voltage of at least one transistor or of at least one tube of the at least one amplifier stage to operate said amplifier stage at the optimal operation point.

3. The broadband high power amplifier of claim 2 wherein the control unit is adapted to adjust continuously or with preset increments a quiescent current or a supply voltage, respectively, of at least one transistor or of at least one tube of said at least one amplifier stage to operate the amplifier stage at the optimal operation point.

4. The broadband high power amplifier of claim 1 wherein the monitoring unit is adapted to monitor at the signal input of the amplifier stage of the broadband high power amplifier at least one of the following signal characteristics of the received input signal:
   an average input power of the input signal,
   a peak input power of the input signal,
   a frequency of the input signal,
   a bandwidth of the input signal.

5. The broadband high power amplifier of claim 1 wherein the monitoring unit is adapted to monitor at the signal output of the amplifier stage of the broadband high power amplifier at least one of the following signal characteristics of the output signal:
   an average forward power,
   a peak forward power,
   a phase of the forward signal,
   an average reflected power,
   a peak reflected power,
   a phase of the reflected signal.

6. The broadband high power amplifier of claim 1 wherein the optimization criterion applied by the control unit to adjust the operating point of the at least one amplifier stage comprises at least one of:
  maximizing of forward power into a load connected to the signal output of the broadband high power amplifier;
  maximizing a power efficiency of the broadband high power amplifier;
  minimizing power dissipation of the broadband high power amplifier.

7. The broadband high power amplifier of claim 1 wherein the optimal operating point of the amplifier stage is located inside a linear operation range of said amplifier stage.

8. The broadband high power amplifier of claim 1 wherein the optimal operating point of the amplifier stage is located outside the linear operation range of said amplifier stage.

9. The broadband high power amplifier of claim 1 wherein the amplifier stages comprise at least one of:
  solid-state amplifier stages including power transistors;
  power tube amplifier stages comprising power tubes.

10. The broadband high power amplifier of claim 1 wherein the amplifier stages comprise at least one of:
  switched amplifier stages;
  conduction angle amplifier stages.

11. The broadband high power amplifier claim 1 wherein the at least one amplifier stage comprises a passive or active cooling device adapted to cool the respective amplifier stage.

12. An electromagnetic compatibility, EMC, test setup, the EMC test setup comprising:
  at least one broadband high power amplifier used to amplify a continuous wave or pulsed RF test signal, the broadband high power amplifier comprising:
    a signal input adapted to receive an input signal;
    at least one amplifier stage adapted to amplify the received input signal, wherein the amplifier stage comprise amplifier stages of different classes selected from at least one of switching amplifier stages such as class D amplifier stages and/or non-switching conduction angle amplifiers such as class A, B, AB and class C amplifier stages;
    a signal output adapted to output the signal amplified by the at least one amplifier stage as an output signal;
    a monitoring unit adapted to monitor signal characteristics of the input signal and the output signal; and
    a control unit adapted to operate the at least one amplifier stage at an optimal operating point depending on the current signal characteristics monitored by said monitoring unit, wherein the control unit is adapted to operate the at least one amplifier stage at an optimal operating point which achieves at least one predefined or selected optimization criterion, and wherein the control unit is adapted to take into account the selected optimization criterion, the amplifier class of the respective stage, and the current signal characteristics of the respective amplifier stages received from the monitoring of the broadband high power amplifier.

13. A method for operating a broadband high power amplifier having one or more amplifier stages, wherein the amplifier stage comprise amplifiers stages of different classes selected from at least one of switching amplifier stages such as class D amplifier stages and/or non-switching conduction angle amplifiers such as class A, B, AB and class C amplifier stages, the method comprising the steps of:
  monitoring, by a monitoring unit, signal characteristics of an input signal received at a signal input of an amplifier stage of said broadband high power amplifier and signal characteristics of an output signal output at a signal output of the amplifier stage of said broad band high power amplifier; and
  controlling the at least one amplifier stage of said broadband high power amplifier to operate at an optimal operation point depending on the monitored signal characteristics which achieves at least one predefined or selected optimization criterion, wherein the step of controlling takes into account the selected optimization criterion, the amplifier class of the respective stage, and the current signal characteristics of the respective amplifier stage received from the monitoring unit of the broadband high power amplifier.

14. The method of claim 13 wherein an operation current or an operation voltage of at least one transistor or of at least one tube of the amplifier stage is adjusted to continuously or with preset increments to operate the amplifier stage at the optimal operation point which is determined in response to the monitored signal characteristics according to at least one predefined or selected optimization criterion.

15. The method according of claim 13 wherein the monitored signal characteristics of the input signal comprise at least one of:
  an average input power of the input signal,
  a peak input power of the input signal,
  a frequency of the input signal,
  a bandwidth of the input signal.

16. The method according of claim 13 wherein the signal characteristics of the output signal comprises at least one of:
  an average forward power,
  a peak forward power,
  a phase of the forward signal,
  an average reflected power,
  a peak reflected power,
  a phase of the reflected signal.

* * * * *